US005494840A

United States Patent [19]
Ohmi

[11] Patent Number: 5,494,840
[45] Date of Patent: Feb. 27, 1996

[54] METHOD FOR MANUFACTURING DRAM MEMORY CELLS HAVING A THIN METAL OXIDE FILM ON A THIN METAL FILM

[76] Inventor: Tadahiro Ohmi, 1-17-301, Komegabukuro, 2-chome, Aoba-Ku, Sendai-shi, Miyagi-Ken 980, Japan

[21] Appl. No.: 81,371

[22] PCT Filed: Dec. 27, 1991

[86] PCT No.: PCT/JP91/01797

§ 371 Date: Jul. 1, 1993

§ 102(e) Date: Oct. 13, 1993

[87] PCT Pub. No.: WO92/12537

PCT Pub. Date: Jul. 23, 1992

[30] Foreign Application Priority Data

Jan. 1, 1991 [JP] Japan ............... 3-010006

[51] Int. Cl.[6] ............... H01L 21/70; H01L 27/00
[52] U.S. Cl. ............... 437/52; 437/60; 437/919
[58] Field of Search ............... 437/919, 52, 60; 148/118, 169

[56] References Cited

U.S. PATENT DOCUMENTS

| | | | |
|---|---|---|---|
| 4,002,545 | 1/1977 | Fehiner | 204/192 |
| 4,432,035 | 2/1984 | Hsieh et al. | 361/322 |
| 4,495,219 | 1/1985 | Kato | 427/82 |
| 5,142,438 | 8/1992 | Reinberg et al. | 361/313 |
| 5,217,914 | 6/1993 | Matsumoto et al. | 437/47 |

FOREIGN PATENT DOCUMENTS

| | | |
|---|---|---|
| 57-30358 | 2/1982 | Japan . |
| 62-120072 | 6/1987 | Japan . |

*Primary Examiner*—Olik Chaudhuri
*Assistant Examiner*—H. Jey Tsai
*Attorney, Agent, or Firm*—Young & Thompson

[57] ABSTRACT

A method for manufacturing memory cells of a DRAM, which are manufactured easily with a high yield, and have high breakdown voltages and large capacitance. In the method, after forming a metallic thin film comprising at least one layer on a substrate, the surface of the metallic thin film is directly oxidized, and a thin film of a metallic oxide is formed on the surface of the metallic thin film.

8 Claims, 17 Drawing Sheets

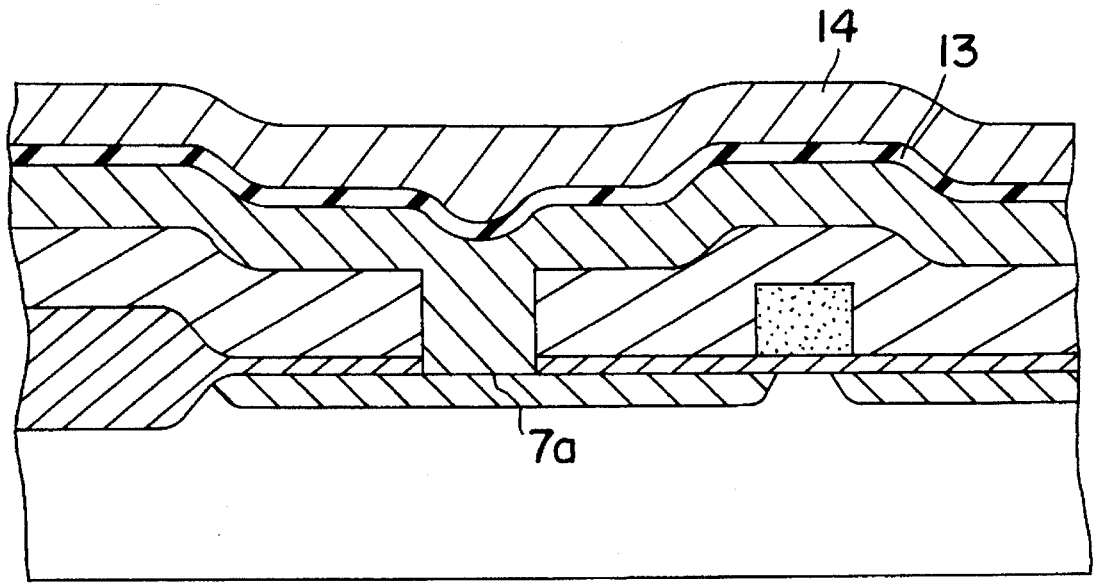
F I G. 11
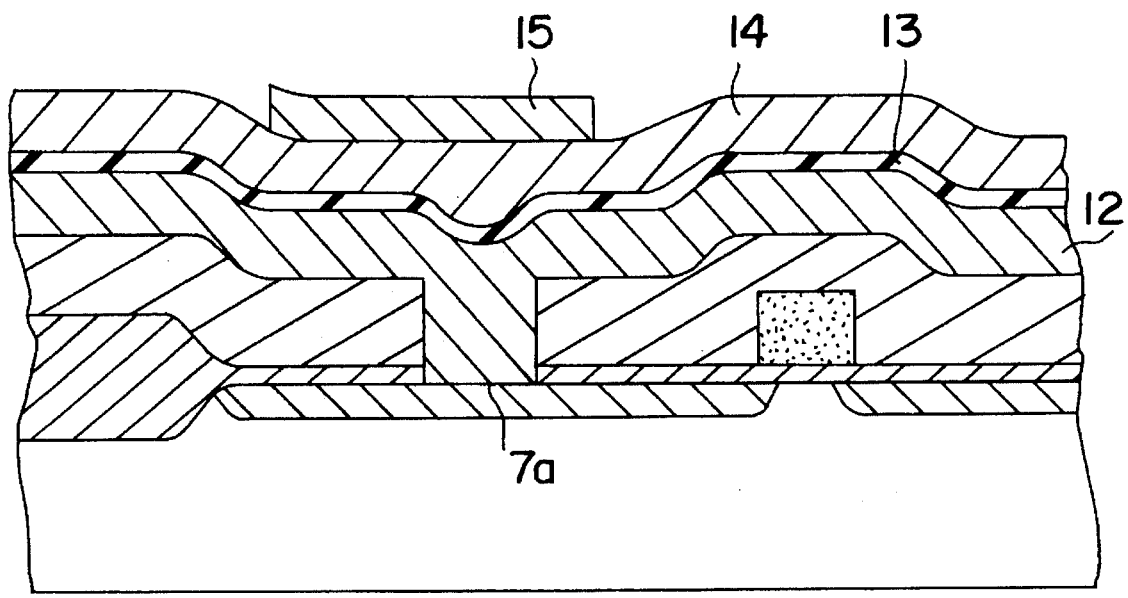
F I G. 12

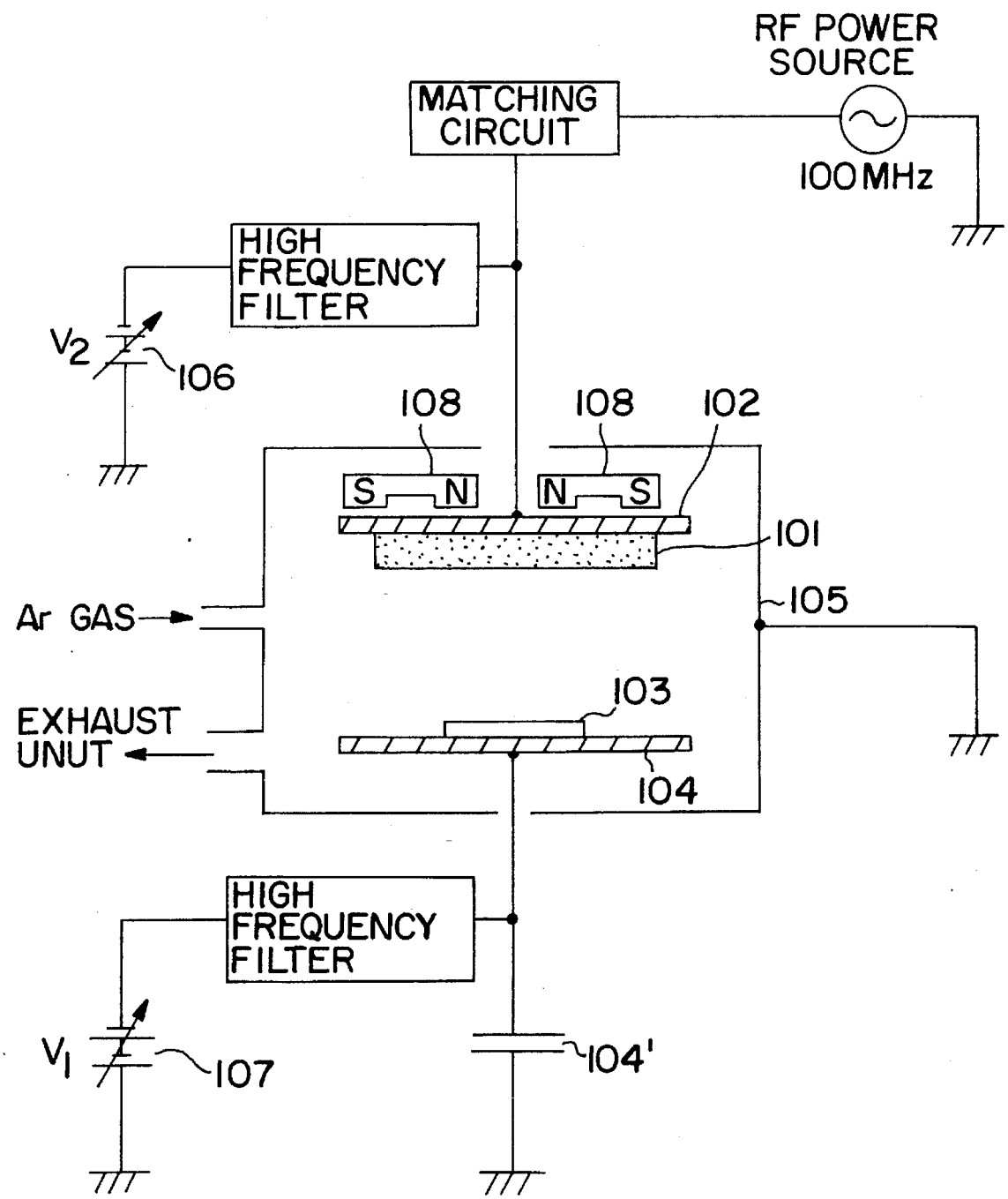
F I G. 22

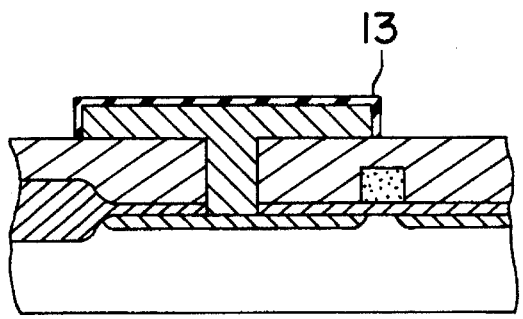
FIG.31(a)
PRIOR ART
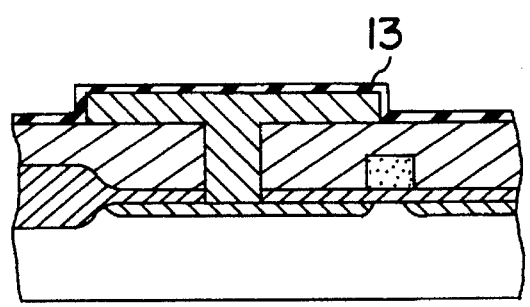
FIG.31(a')
PRIOR ART
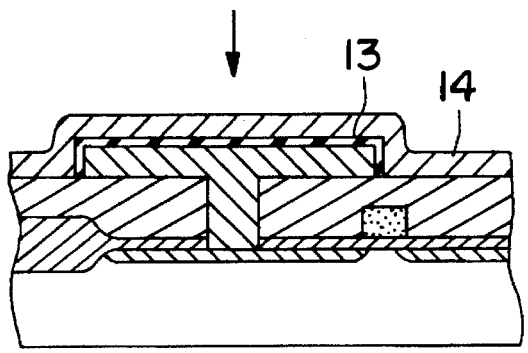
FIG.31(b)
PRIOR ART
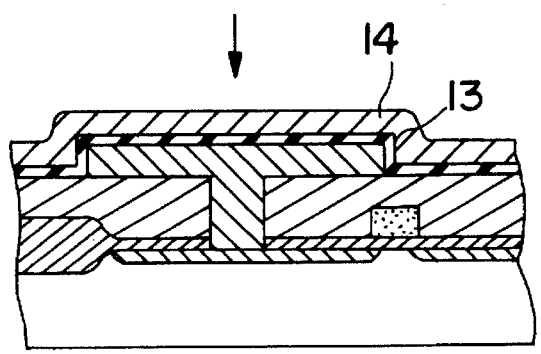
FIG.31(b')
PRIOR ART

METHOD FOR MANUFACTURING DRAM MEMORY CELLS HAVING A THIN METAL OXIDE FILM ON A THIN METAL FILM

FIELD OF THE INVENTION

The present invention relates to a manufacturing method for memory cells of a DRAM (dynamic RAM).

BACKGROUND OF THE INVENTION

DRAMs having a variety of structures have been previously disclosed; they can be generally divided into stacked capacitor types, trench capacitor types, fin types, and the like. An equivalent circuit such as that used in all types is shown in FIG. 26; the capacitor is formed by means of a insulation film 40 placed between two electrodes 41 and 42, and switch 43 comprises an MOS transistor.

The accumulation charge Q in the capacitor is expressed by the following formula.

$$Q =; CV_{dd} \tag{1}$$

wherein,

C: capacitance $V_{dd}$: voltage

Furthermore, C is expressed by means of the following formula.

$$C: S\epsilon_r\epsilon_o/d \tag{2}$$

Herein,

S: opposing surface area $\epsilon_r$: relative dielectric constant $\epsilon_o$: dielectric constant of the insulating film d: insulation film thickness In the case in which a leak of a more or less fixed size is present in the packaged memory, if such a leak having a fixed size is permitted, it is preferable that accumulation charge Q be as large as possible. In order to increase the size of accumulated charge Q, as is clear from formulas (1) and (2), the size of dielectric constant e o may be enlarged, the opposing surface area S may be increased, or the insulation film thickness d may be reduced.

However, the recent increase in the density of DRAMs has been striking, enterring the submicron realm. When such an increase in density is carried out, the value of the opposing surface area S is reduced, and when the value of S is reduced, as can be seen from the above formulas, the capacitance C is also reduced. As a result, various methods have been attempted to increase the value of C by increasing the value of $\epsilon_o$ or of S.

However, an increase in the dielectric constant would appear from formulas (1) and (2) to lead to an increase in the accumulation charge Q; however, materials having a large dielectric constant $\epsilon_o$ have poor insulating properties, and as a result, the likelihood of charge leaks increases. An increase in $\epsilon_o$ has been carried out.

Accordingly, in order to increase the accumulation charge Q, it is not sufficient to merely increase the value of capacitance C by increasing the value of $\epsilon_o$ or the value of opposing surface area S, but rather, the insulating characteristics must be improved.

Here, to consider the conventional technology, improvements to the DRAMs having the structures described above have been attempted in order to maintain the capacitance C at a level above a specified value (40 fF or more). The trench capacitance type has the structure shown in FIG. 27, the fin type has the structure shown in FIG. 28, and the stacked capacitor type has the structure shown in FIG. 29.

In the trench capacitor type, an attempt is made to increase the opposing surface area S, and thus the capacitance, by filling a groove with an insulation film 23 and a metal film 12.

However, when the groove in a trench capacitor type becomes deep, and the aspect ratio thereof reaches a level of 20–30, the cleaning of the interior of the groove becomes difficult, and film deposition may be conducted on the contaminated surface. Furthermore, insulation breakdown occurs easily in the corner areas of the groove, so that the reliability and yield thereof are extremely poor.

The fin type is employed in order to increase the opposing surface area by means of the multilayering of metal film 12, and in order to thus increase the capacitance. However, it is also difficult to conduct cleaning in the interior of the very detailed structure of the fin type, and furthermore, defects in resistance to insulation breakdown occur easily at edge areas thereof.

On the other hand, the stacked capacitor type is easier to manufacture than the trench capacitor type or the fin type, and furthermore, has superior reliability and yield.

Conventionally, a stacked capacitor type was produced in the following manner. To explain based on FIGS. 30 and 31, the surface of an $N^+$ region 7 which was covered by an insulation film 3 was exposed by means of an RIE method (reactive ion etching), or the like, and a conductive film 12 was formed thereon by means of depositting polysilicon; after this, a resist 15 was formed with a desired pattern by means of resist application and photolithography (FIG. 30(a)) and a first electrode 12d was formed by means of RIE (FIG. 30(b)). Next, the surface of a base electrode 2d was oxidized by means of heating in an oxidizing atmosphere, and an insulation film 13 comprising polysilicon oxides was formed on the surface of the lower electrode 12d (FIG. 31(a)); after this, polysilicon was deposited over the entire surface by means of a CVD method, thus forming an upper electrode 14 (FIG. 31(b)). In accordance with this method, the insulation film 13 comprises $SiO_2$; however, as the dielectric constant of $SiO_2$ is low, having a value of 3.9, it was impossible to obtain an DRAM memory cell having large capacitance.

Attempts have been made to deposit, in the state shown in FIG. 31(b), $Si_2N_3$, which has a higher dielectric constant (dielectric constant: 8.0) than that of $SiO_2$, to utilize this $Si_2N_3$ as an insulation film (FIG. 31(a')), and to deposit polysilicon on top of this to form an upper electrode 14 (FIG. 31(b')). However, as the insulation film is a deposition film, it includes a plurality of pin holes, and accordingly, deficiencies In breakdown resistance occurred easily. Furthermore, attempts were made to close these pin holes by means of heating processing after the deposition of the $Si_2N_3$. However, in the course of these attempts, the surface of the $Si_2N_3$ was oxidized as a result of the heating processing, and became $SiN_xO_y$, so that the actual dielectric constant had a value within a range of 3.9–8, and the dielectric constant thus decreased in an undesirable manner as a result of the heating processing.

Thus, a DRAM memory cell having a capacitor with a large capacitance and having a high breakdown voltage was not conventionally available.

It is an object of the present invention to provide a manufacturing method for DRAM memory cells which are easily manufactured, have a high yield, have a high breakdown voltage, and have a large capacitance.

SUMMARY OF THE INVENTION

In order to solve the above problems, the present invention has as an object thereof to provide a manufacturing method for DRAM memory cells having at least:

a first process, in which a substrate and a first region of opposite conductive type are formed, and the surface of the first region of the substrate, the surface of which is covered with an insulation film is exposed, a second process, in which a metal thin film comprising at least 1 layer is formed, a third process, in which a thin film comprising an oxide of a metal is formed on the surface of said metal thin film by means of the direct oxidation of the surface of the metal thin film, a fourth process, in which a conductive thin film having at least 1 layer is formed, and a fifth process, in which an interlayer insulation film is formed, and thereafter, wiring lines are formed.

In the present invention, it is possible to use Si wafers, compound semiconductor wafers, or substrates having a semiconductor film formed on the insulation film surface.

The method used for the formation of the first region which has an opposite conductive type from that of the substrate is not particularly restricted; for example, ion implantation may be employed.

The method used for the first process, in which the surface of the first region of the substrate is exposed, is also not particularly restricted; for example, an RIE (reactive ion etching) method using a gas which is appropriate to the type of insulation film may be employed.

It is desirable that the material which is used for the metal thin film (lower electrode) which is formed in the second process be a material having an oxide which has a high dielectric constant. For example, examples thereof include Ta, Ti, Hf, Zr, Nb, and the like.

The metal thin film may have a single layered structure, or a multilayered structure comprising 2 or more layers. In the case of a multilayered structure comprising 2 or more layers, it is desirable that the bottommost layer comprise Cr, as this increases the adhesion between the metal thin film and the insulation film covering the substrate surface.

On the other hand, it is possible to use, as the material used in the conductive thin film (upper electrode), for example, Ta, Ti, polysilicon, silicide, or other materials having desired conductivity.

In the case in which a high temperature process having a temperature of 500° C. or more is employed after the formation of the upper electrode, it is preferable that the upper electrode comprise a metal identical to that of the lower electrode. That is to say, in the case in which these 2 electrodes are comprising differing metals (for example, if the lower electrode comprises Ta, while the upper electrode comprises Ti), when a temperature of 500° C. or more is reached, $Ta_2O_5$ and Ti react, and the $Ta_2O_5$ will be reduced, so that this tends to lead to a worsening of the resistance to breakdown of the oxide film. It is of course the case that when a high temperature process is not conducted after the formation of the upper electrode, the 2 electrodes may be formed from materials having differing conductivities. The formation method of the metal thin film is not particularly restricted; for example, a DC-RF sputtering device (Japanese Patent Application, First Publication, Laid-Open No. Sho 62-287071) such as that shown in FIG. 22, in which an external bias voltage is applied to substrate 103, and film formation thus conducted, or a 2-cycle excited sputtering device (Japanese Patent Application, First Publication, Laid-Open No. Sho 63-50025) such as that shown In FIG. 23, in which the RF power frequency is caused to be different on the substrate side $f_2$ and the target side $f_1$, and film formation thus conducted, may be employed. Of course, other methods, for example, a CVD method, may also be employed.

In the present invention, an oxide thin film is formed on the metal thin film by means of the direct oxidation of this metal thin film.

In this manner, it is possible to obtain an insulation film which has a high breakdown voltage, by means of the direct oxidation of the metal thin film.

Examples of this direct oxidation method include a method in which the substrate is heated in an atmosphere of an oxidizing gas (for example, $O_2$ gas or a mixed gas of $O_2$ and $N_2$ gases).

Furthermore, examples of a method for the oxidation of a substrate in a state in which the substrate is maintained at a low temperature include, for example, a method in which oxygen gas molecules are supplied to the surface of the metal film, and this surface is irradiated with inert gas ions having a kinetic energy of 90 eV or below. In this method, for example, when the metal surface is struck by Ar ions, the surface atomic layer is activated without creating defects. Ions having a kinetic energy of 25 eV penetrate only to a 2–3 atom layer of the surface, so that the energy is transmitted only to the surface. In addition, it is possible to effectively raise the temperature of the metal surface. When oxygen gas is simultaneously introduced into the deposition chamber, the oxygen molecules and the oxygen radicals produced by discharge are absorbed by the metal surface, and cause a reaction with the metal at the metal surface, the temperature of which has been increased by Ar ion irradiation. By means of this, the oxidation of the metal is furthered.

Accordingly, it is possible to form a metal oxide film (for example, $Ta_2O_5$ film) having a thickness of 5–10 nm even if the substrate temperature is not raised to 400° C.; such formation is possible even at temperatures from 150°–200° C. Furthermore, if the energy of the irradiated ions is maintained at a level of 90 eV or below, no damage will be done to lower areas.

Examples of devices for irradiating ions having an energy of 90 eV or below in this manner include, for example, the devices shown in FIGS. 22 and 23; herein, $O_2$ gas and Ar gas are introduced into the device, and plasma generation may be conducted in an atmosphere of 1 mTorr—tens of mTorr, under conditions such that the frequency on the substrate side is 50 MHz, and the frequency on the target side is 200 MHz, and the RF power is set within a range of 10–50 W.

It is preferable to avoid the formation of a natural oxide film on the alloy thin film, by means of consecutively conducting the second and third processes in the same vacuum device without disturbing the vacuum.

Furthermore, in the case in which the second and third processes are not conducted in the same device, the transportation from the device in which the second process was conducted to the device in which the third process was conducted should be conducted in an atmosphere of an inert gas, or in a highly pure air atmosphere having a moisture concentration of 10 ppb or below. Of these, it is particularly preferable that L transportation be conducted in a highly pure air atmosphere having a moisture concentration of 10 ppb or below.

In the case of inert gas, when a person makes a mistake during the process of transportation and sticks his head into the chamber, a state of oxygen deprivation results. However, in the case of an air atmosphere, such a state can be avoided. The discovery that an air atmosphere can be used in this manner was discovered for the first time by the present inventors. That is to say, it had been thought that in a gas atmosphere containing oxygen such as air, the surface of a substrate or the surface of metal wiring formed on a substrate was readily subject to natural oxidation. However, as a result of the diligent research of the present inventors, it was discovered that even if oxygen is contained in the atmosphere, if the moisture concentration is maintained at a level of 10 ppb or below, natural oxidation does not occur. Accordingly, it is possible to use atmospheric air if it is purified so as to have a moisture concentration of 10 ppb or below.

It is possible to use, as the substrate transfer mechanism in accordance with the present invention, a mechanism such as that shown in FIG. 24, in which various devices 302–305 are connected i by means of a tunnel 301. This tunnel 301 is isolated from the outside atmosphere, and a gas having a moisture concentration of 10 ppb or below is caused to flow through the interior of tunnel 301.

Within tunnel 301, gas is injected so as to be in contact with the lower surface of the substrates, so that by means of this gas, it is possible to transport the substrates in a suspended manner.

Moreover, it is also possible to transport the substrates by means of an device such as that shown in FIG. 25, in which a box 306, the interior of which is filled with a gas having a moisture concentration of 10 ppb or below, is used for this transportation.

BRIEF DESCRIPTION OF THE DRAWINGS

FIG. 11 is a process cross sectional diagram in accordance with a first embodiment of the present invention, FIG. 12 is a process cross sectional diagram in accordance with a first embodiment of the present invention.

FIG. 22 is a conceptual drawing of an example of a device used in the formation of a film and the like in the present invention.

FIGS. 31a to 31b are a process cross sectional diagram showing a conventional manufacturing method for DRAM memory cells.

DETAILED DESCRIPTION OF THE INVENTION

Hereinbelow, embodiments of the present invention will be explained based on the diagrams.

Figure 1:
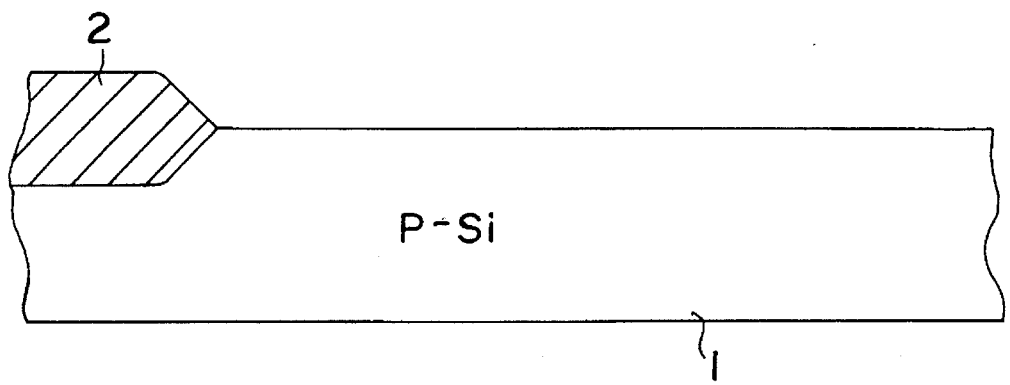
FIG. 1 is a process cross sectional diagram in accordance with a first embodiment of the present invention.

A manufacturing process of Embodiment 1 is shown in FIG. 1.

In the present example, a P-type Si substrate 1 was used as the semiconductor substrate.

On Si substrate 1, a $SiO_2$ field oxidation film 2 having a thickness of approximately 1 μm is formed by means of LOCOS (local oxidation of silicon) (FIG. 1).

Figure 2:
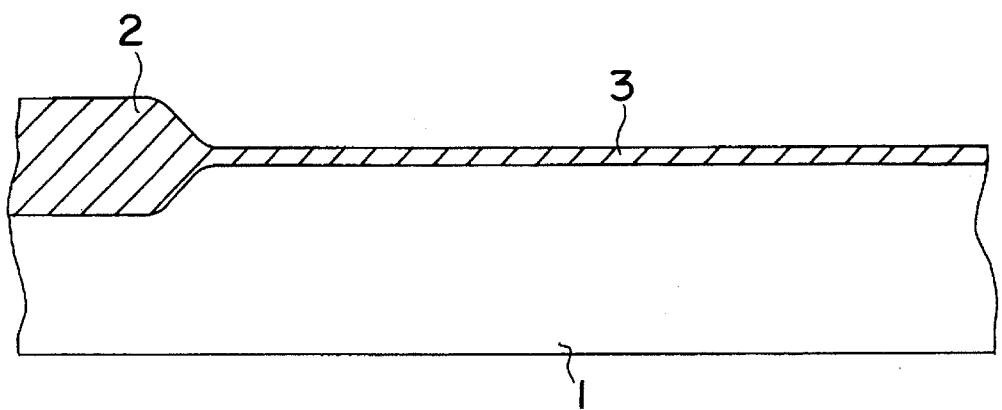
FIG. 2 is a process cross sectional diagram in accordance with a first embodiment of the present invention.

Next, a 10 nm gate oxidation film 3 is formed on the surface of substrate 1 by means of heating for 30 minutes at a temperature of 900° C. in a dry ;oxygen atmosphere (FIG. 2).

Figure 3:
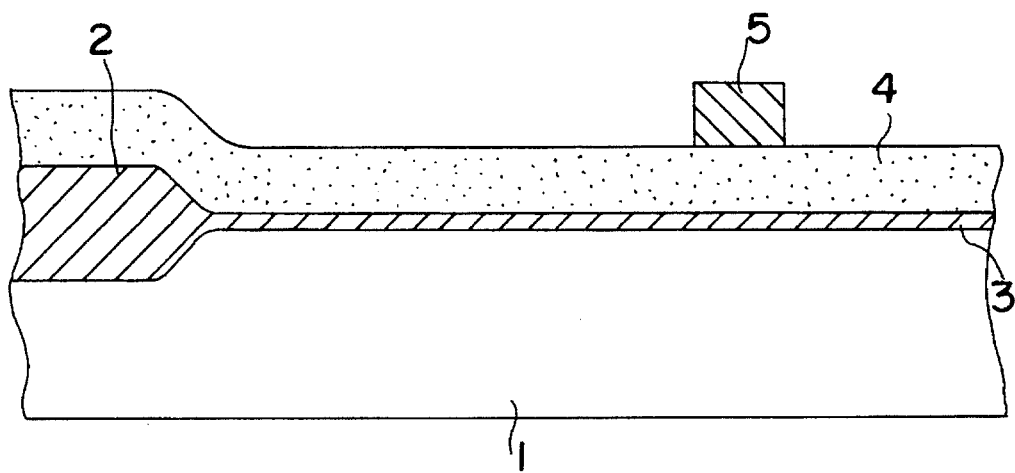
FIG. 3 is a process cross sectional diagram in accordance with a first embodiment of the present invention.

Next, an $N^+$ polysilicon layer 4, which serves as the lower electrode, is deposited over the entire surface by means of the LPCVD method, and after resist has been applied on top of this, this resist 5 is formed into a pattern by means of photolithography (FIG. 3).

Figure 4:
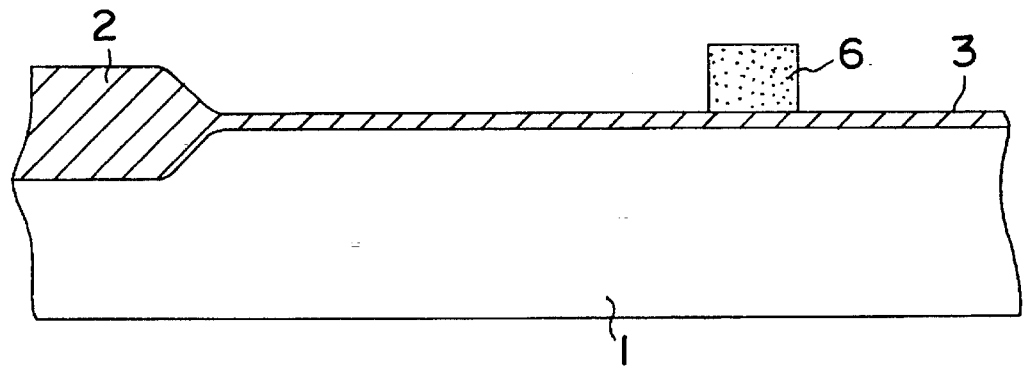
FIG. 4 is a process cross sectional diagram in accordance with a first embodiment of the present invention.

Next, resist 5 is subjected to masking by means of RIE, polysilicon 4 is removed, and gate electrode (word line) 6 is formed (FIG. 4).

Figure 5:
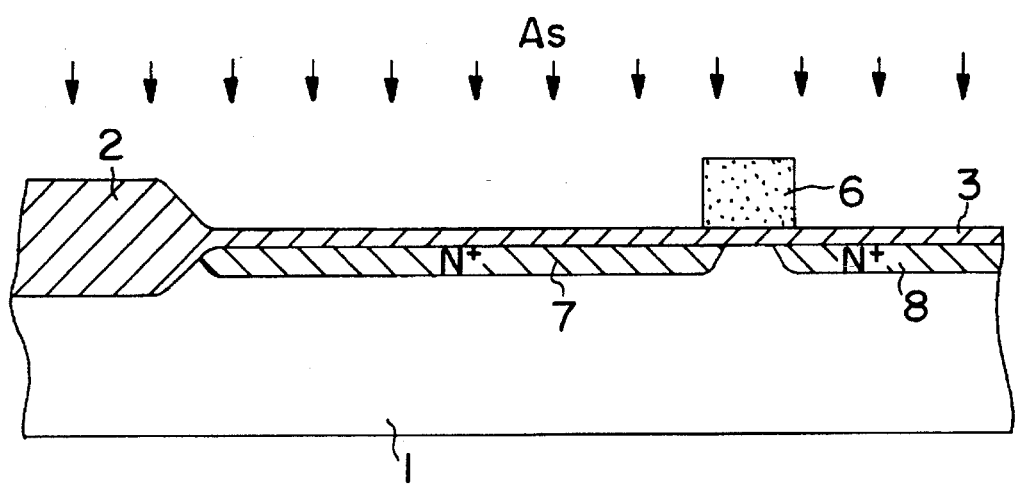
FIG. 5 is a process cross sectional diagram in accordance with a first embodiment of the present invention.

Next, gate electrode 6 is subjected to masking, and the entire surface is subjected to ion implantation using As at 50 kV, and at a density of $5 \times 10^{15}/cm^2$. After this, annealing is conducted in an atmosphere of $N_2$ for a period of 30 minutes at a temperature of 900° C., and thereby, the defects created by the ion implantation are repaired and N⁺ regions 7 and 8 are formed (FIG. 5).

This N⁺ region 7 is the first region in accordance with the present invention.

Figure 6:
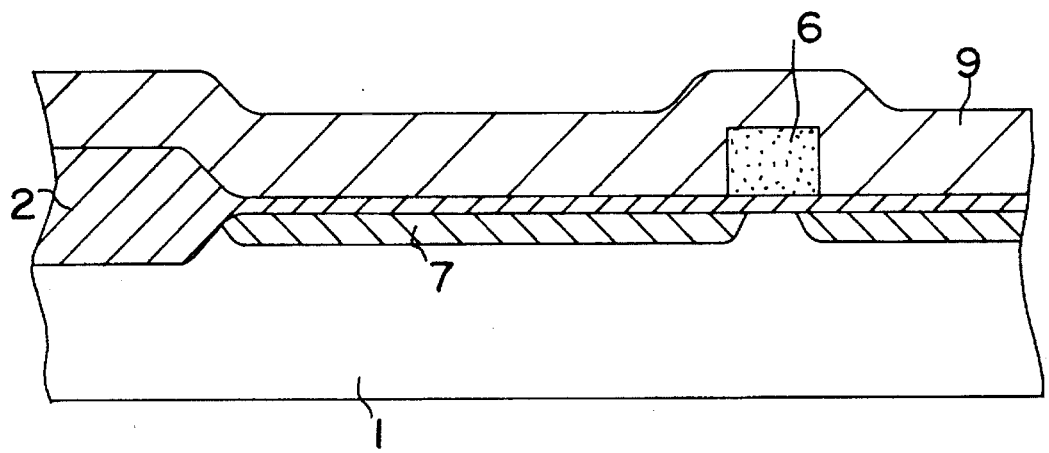
FIG. 6 is a process cross sectional diagram in accordance with a first embodiment of the present invention.

Next, SiH₄ and O₂ are; reacted by means of a normal pressure CVD method, and an SiO₂ film 9 is deposited over the entire surface (FIG. 6).

Next, the first process in accordance with the present invention is conducted as follows.

Figure 7:
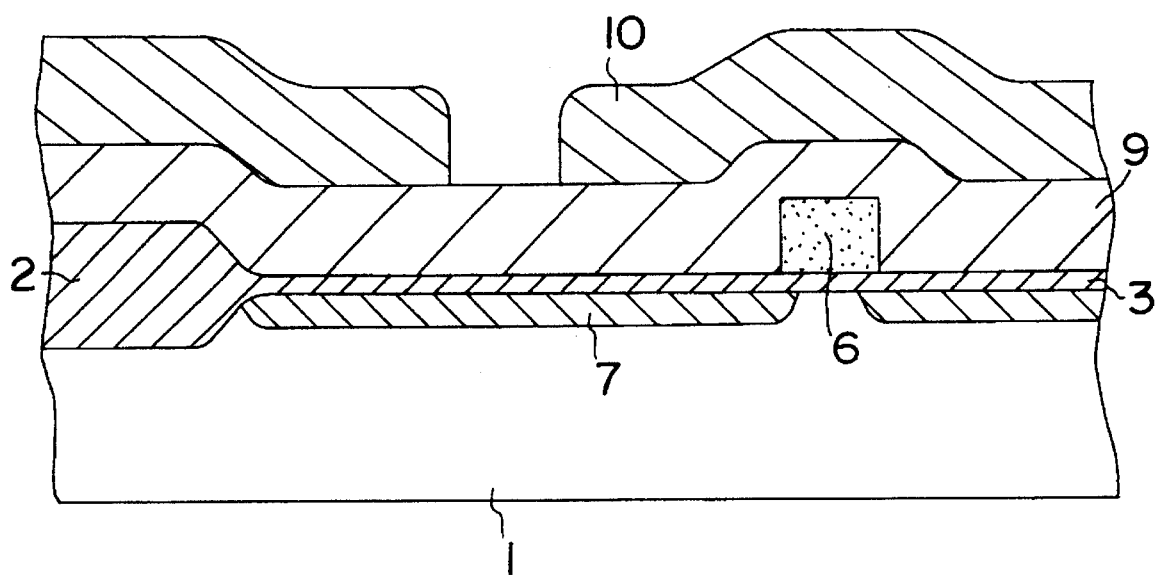
FIG. 7 is a process cross sectional diagram in accordance with a first preferred embodiment of the present invention.
Figure 8:
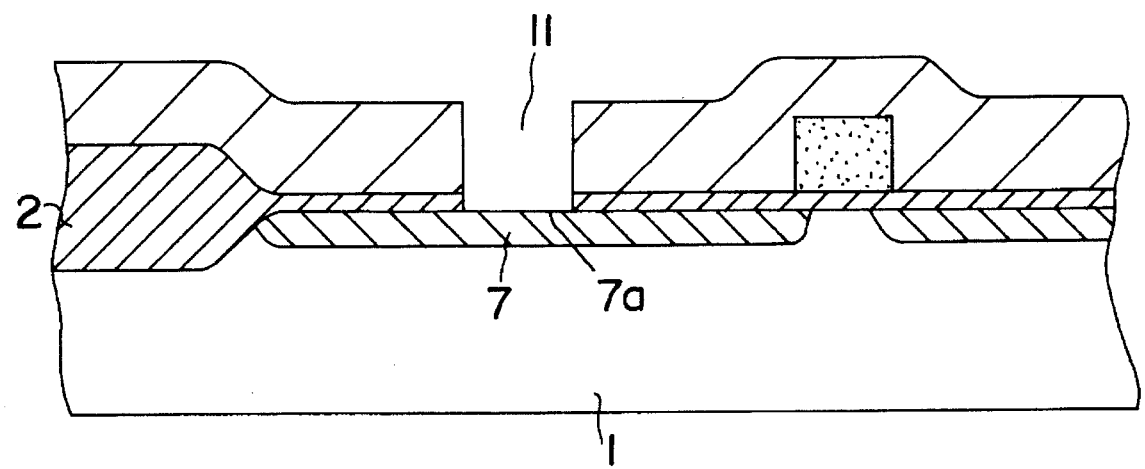
FIG. 8 is a process cross sectional diagram in accordance with a first embodiment of the present invention.

First, resist is applied onto the SiO₂ film 9, and a resist pattern is formed by means of photolithography (FIG. 7). Next, the resist 10 is subjected to masking, and SiO₂ film 9 and a portion of gate oxide film 3 are subjected to etching by means of RIE, a portion 7a of the surface of N⁺ region 7 is exposed, and contact hole 11 is formed (FIG. 8).

Next, the second process is carried out in the following manner.

Figure 9:
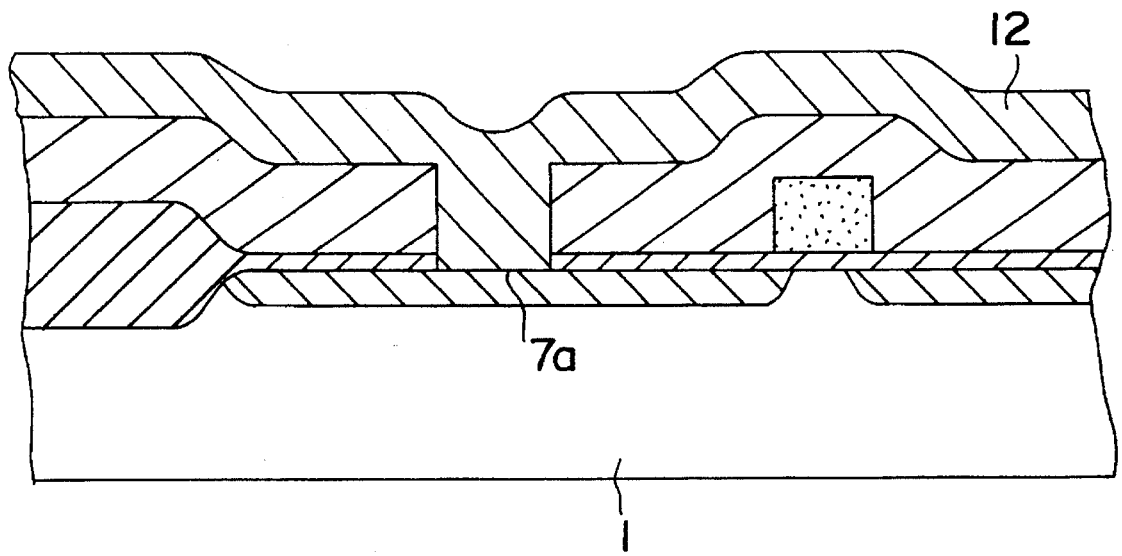
FIG. 9 is a process cross sectional diagram in accordance with a first embodiment of the present invention.

The substrate is placed In a DC-RF coupling sputterring device such as i that shown in FIG. 22, the film deposition chamber is placed in a super high vacuum state with a vacuum degree of 10⁻¹⁰ Torr or below, and subsequently, Ar gas is introduced, and a Ta film 12 having a thickness of 300 nm is deposited by means of sputterring. At this time, at the beginning of film formation and during film formation, film formation is conducted while irradiating the surface with Ar ions having a low energy in the tens of eV. By means of such irradiation, a Ta film 12 having extremely good crystallization can be obtained (FIG. 9).

Next, the third process is carried out in the following manner.

Figure 10:
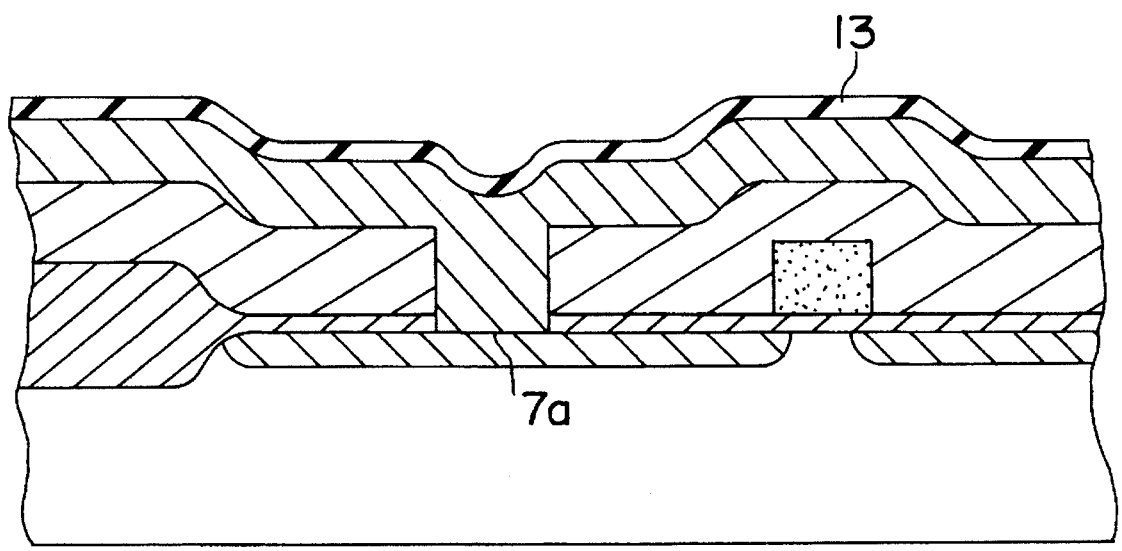
FIG. 10 is a process cross sectional diagram in accordance with a first embodiment of the present invention.

In the present example, the second and third processes are carried out in the same device. That is to say, after the completion of the second process, oxidizing gas is introduced into the device and the oxidation of the Ta film 12 is conducted. It should of course be understood that at this time, the RF power is not applied, so that sputterring is not being conducted. The oxidation of Ta film 12 is accomplished by heating the substrate to a temperature of 400° C. and introducing an oxygen gas having a moisture concentration of 10 ppb or below, and thereby, a Ta₂O₅ film 13 having a thickness of 5 nm is formed (FIG. 10).

Next, the fourth process is carried out in the following manner

That is to say, in the same device in which the second and third processes were conducted, in a manner identical to that in which the second process was conducted, a Ta film 14 is formed as a conductive thin film (FIG. 11). That is to say, in the present example, the lower electrode and the upper electrode comprise the same metal.

Next, the fifth process, that is to say, the formation of an interlayer insulation film and multilayer wiring, is conducted as follows.

Figure 13:
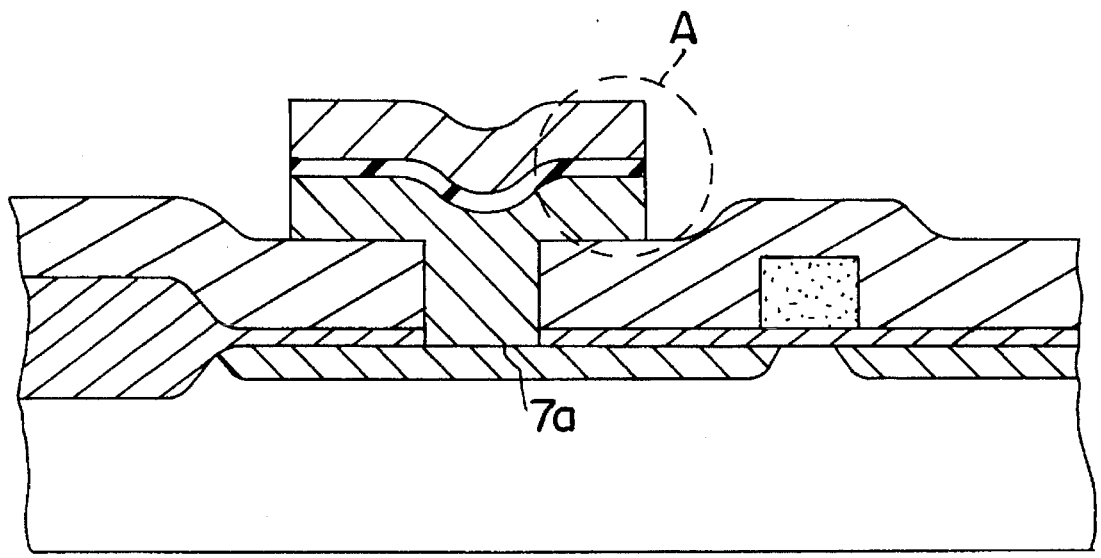
FIG. 13 is a process cross sectional diagram in accordance with a first embodiment of the present invention.

First, resist 15 is formed into a pattern such that the resist remains only directly above N⁺ region 7a (FIG. 12). Next, the resist 15 is subjected to masking, and Ta film 14 is subjected to RIE etching using CF₄ gas, and furthermore, Ta₂O₅ film 13 is subjected to RIE etching using CF₄/H₂ gas, and then Ta film 12 is subjected to RIE etching using CF₄ gas (FIG. 13).

Next, after the removal of tile resist, a SiO₂ film (PSG film) 17 containing P, or a SiO₂ film 17, is formed over the entire surface using a normal pressure CVD process. It is possible to deposit a BPSG film in place of the PSG film.

Figure 14:
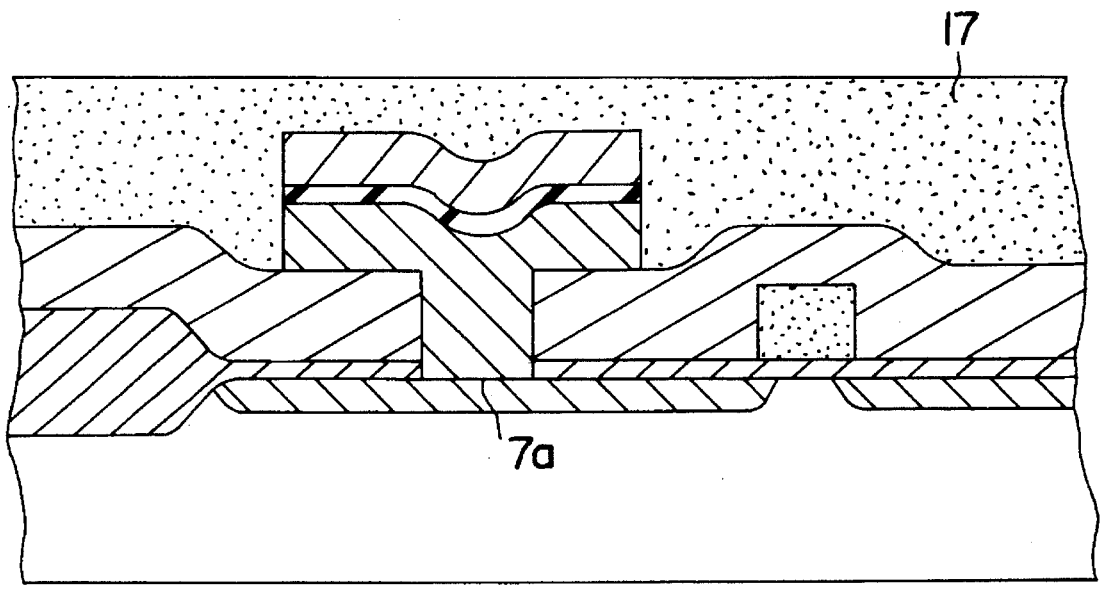
FIG. 14 is a process cross sectional diagram in accordance with a first embodiment of the present invention.

In the present example, the subsequent lithography is conducted with a high degree of precision, so that the surface of PSG film 17 is subjected to flattening (FIG. 14). This flattening may be accomplished, for example, by means of a bias sputterring method or by means of an etching method. It should be understood that other methods may be employed.

Figure 15:
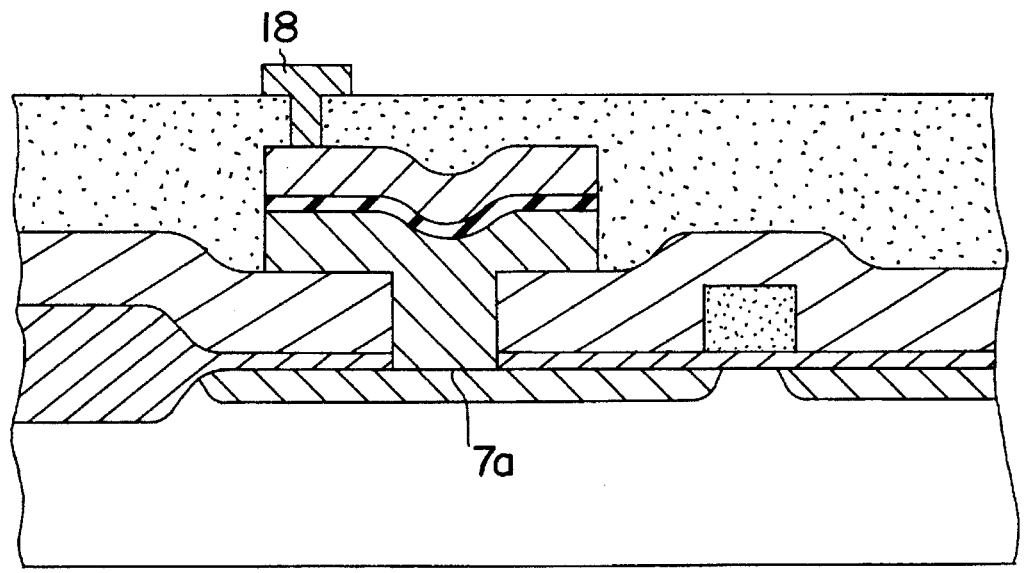
FIG. 15 is a process cross sectional diagram in accordance with a first embodiment of the present invention.

Next, contact holes are opened, and the formation of Al wiring 18, which functions as the first wiring, is accomplished (FIG. 15).

Figure 16:
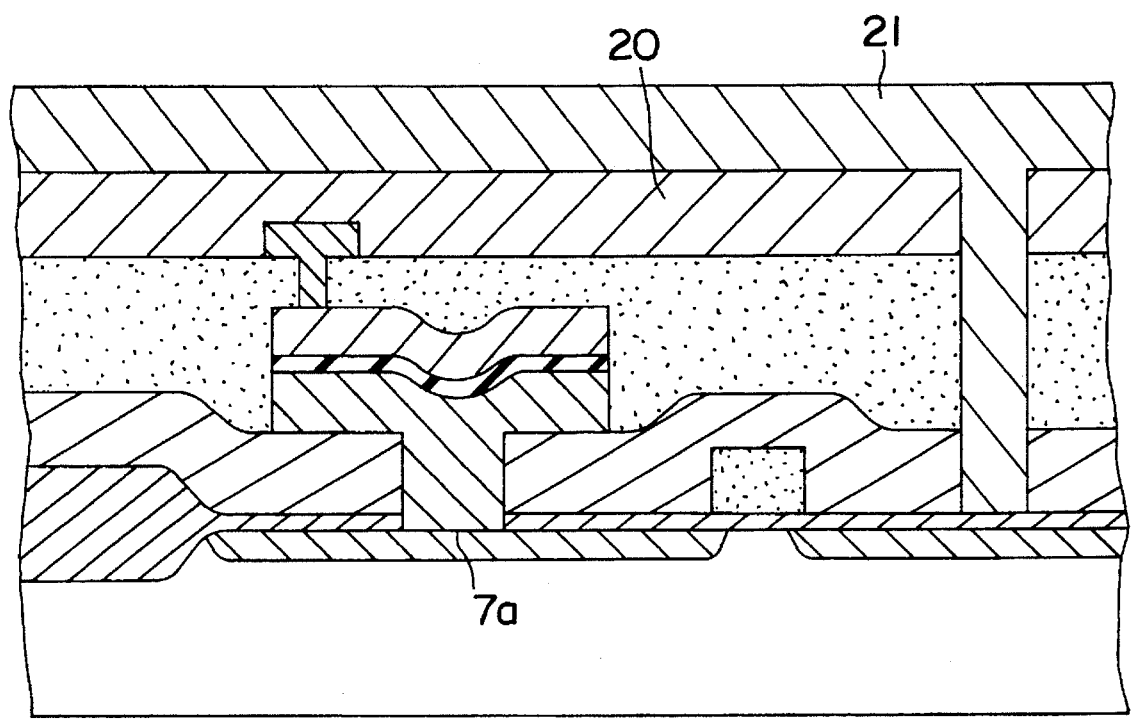
FIG. 16 is a process cross sectional diagram in accordance with a first embodiment of the present invention, FIG, 17 is a process cross sectional diagram in accordance with a first embodiment of the present invention.

Next, a PSG film 20, which functions as a further interlayer insulation film, is formed by means of a sputterring method, etching is conducted by means of an RIE method, and contact holes are opened; thereafter, Al wiring is deposited in contact with N⁺ region 8 as a second wiring, and a bit line 21 is formed (FIG. 16).

The formation of PSG film 20 may be accomplished by means of a plasma CVD method or a spin-on-glass method.

Figure 17:
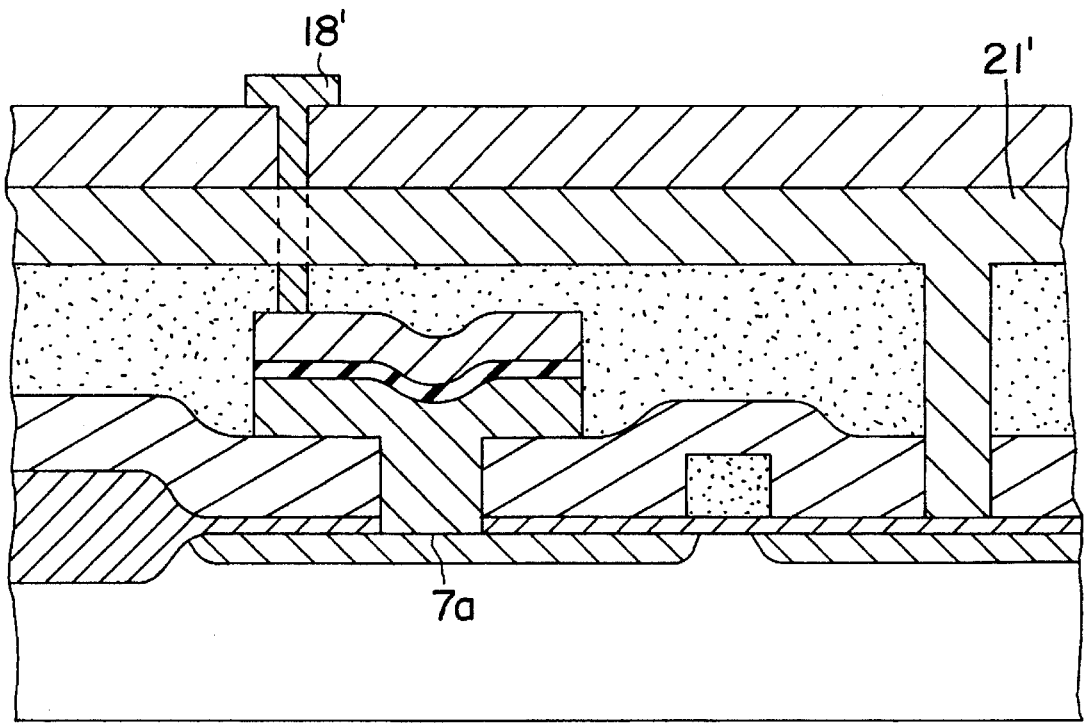
Figure 18:
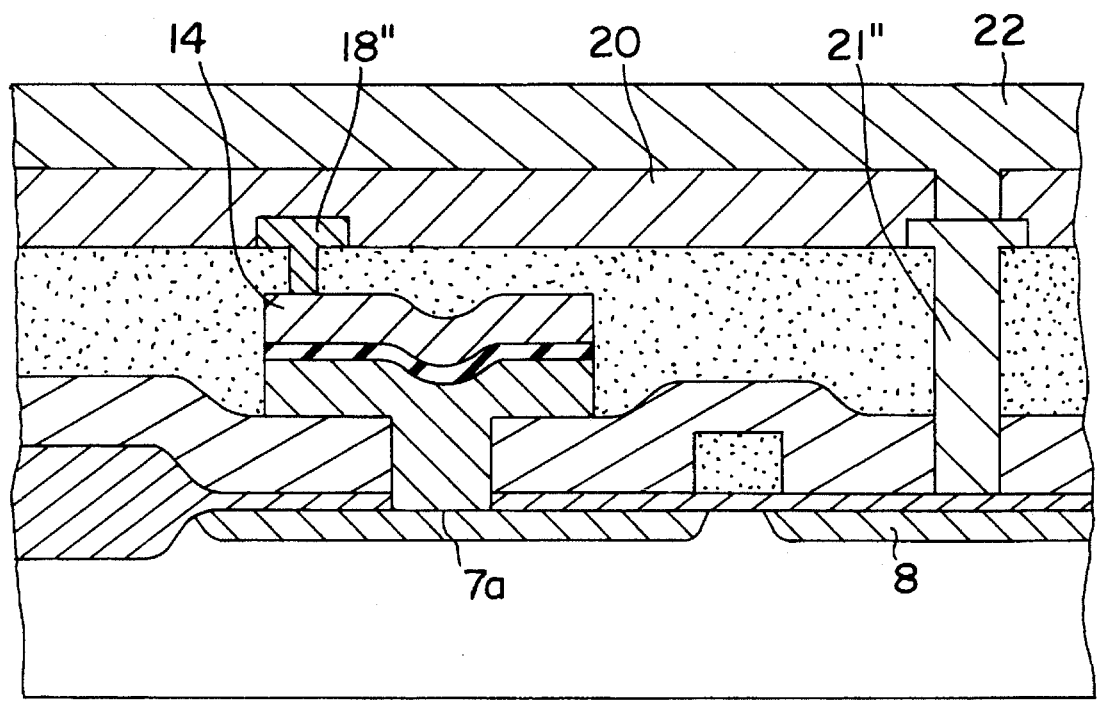
FIG. 18 is a process cross sectional diagram in accordance with a first embodiment of the present invention.

As shown in FIG. 17, after the formation of bit line 21', it is permissible to form. Al wiring 18'. Furthermore, as shown in FIG. 18, it is permissible to simultaneously form Al wiring 18", which is in contact with the Ta film 14, and Al wiring 21", which is in contact with N⁺ region 8, and then finally to form bit line 22.

The semiconductor memory of dynamic type produced by means of the above processes exhibits superior insulation characteristics.

Figure 24:
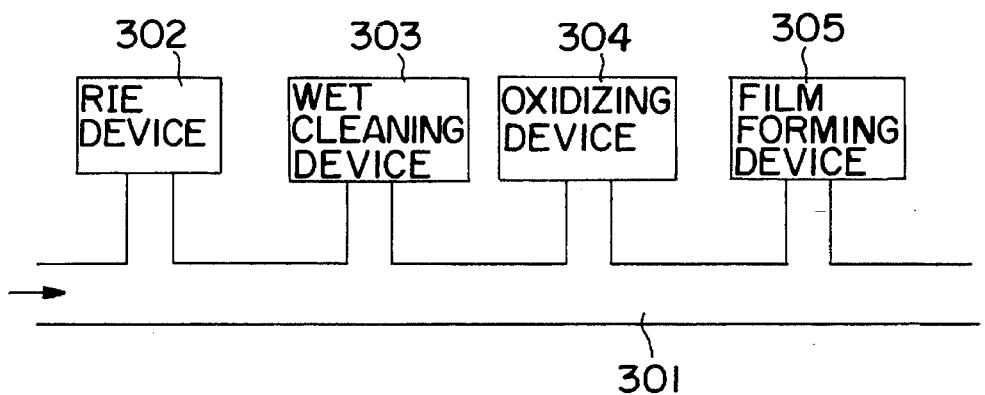
FIG. 24 is a conceptual drawing showing an example of a transportation mechanism.
Figure 25:
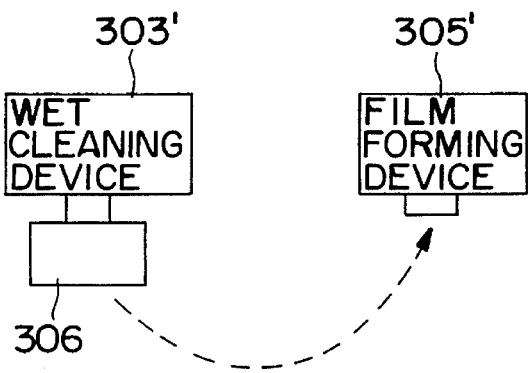
FIG. 25 is a conceptual drawing showing an example of a transportation mechanism.
Figure 26:
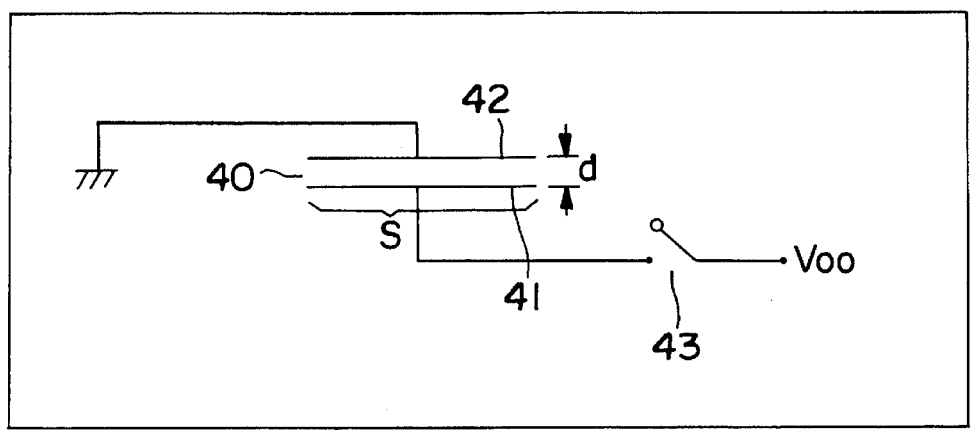
FIG. 26 is an equivalent circuit diagram of a DRAM memory cell.
Figure 27:
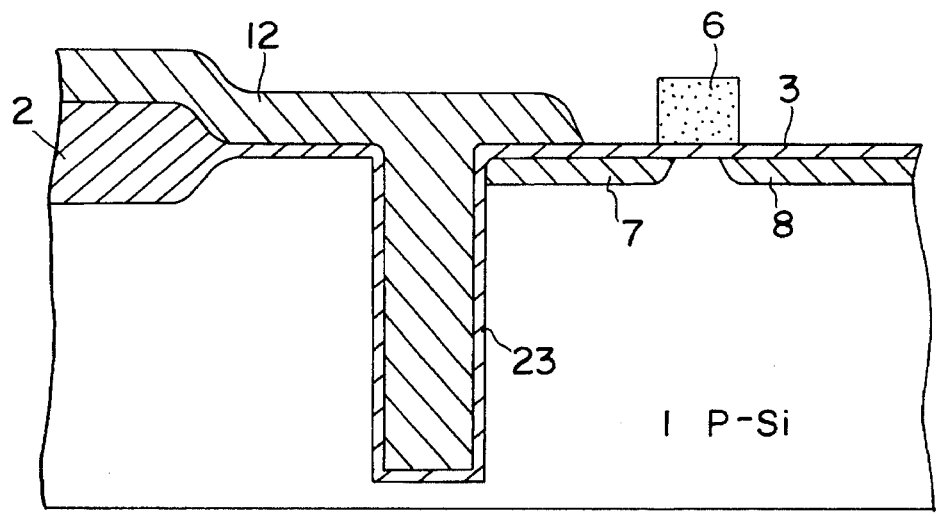
FIG. 27 is a cross sectional diagram showing the structure of a DRAM memory cell.
Figure 28A:
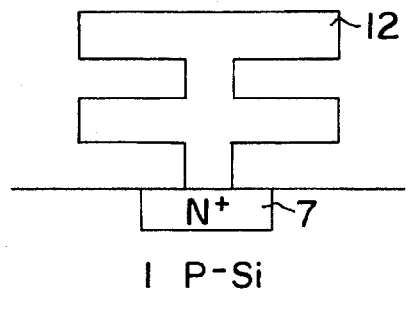
FIGS. 28a to 28b are a cross sectional diagram showing the structure of a conventional DRAM memory cell.
Figure 28B:
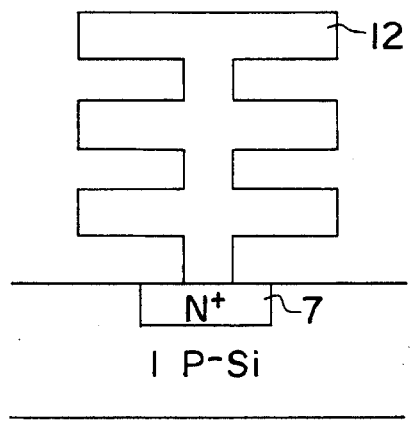
Figure 29:
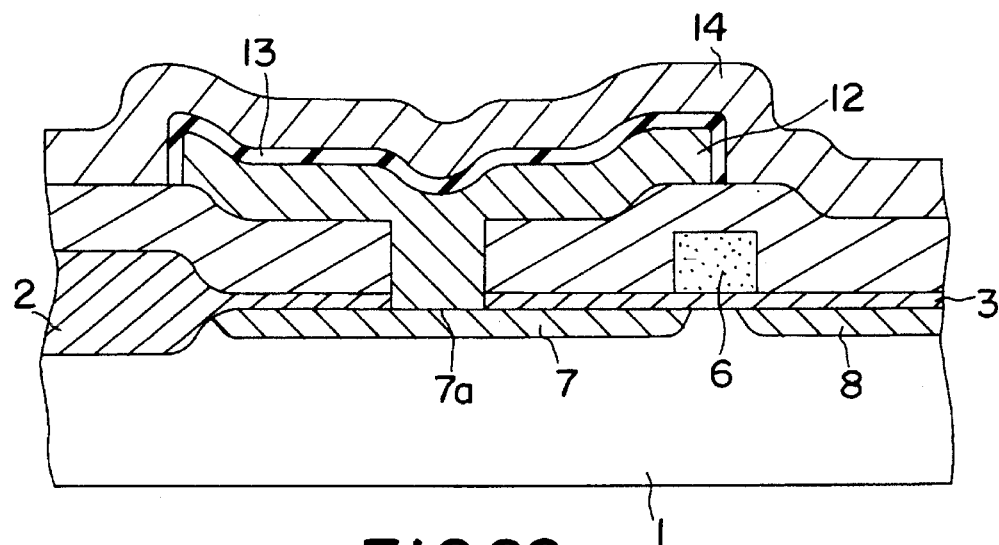
FIG. 29 is a cross sectional diagram showing the structure of a conventional DRAM memory cell.
Figure 30A:
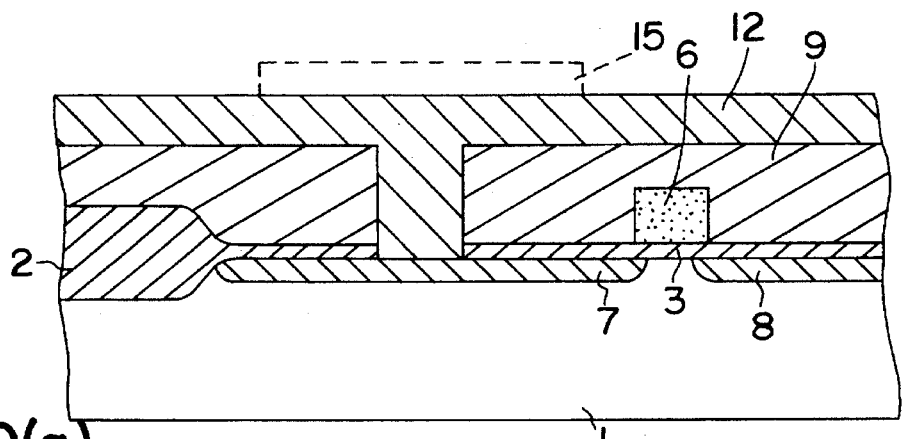
FIGS. 30a 30b are a process cross sectional diagram showing a conventional manufacturing method for DRAM memory cells.
Figure 30B:
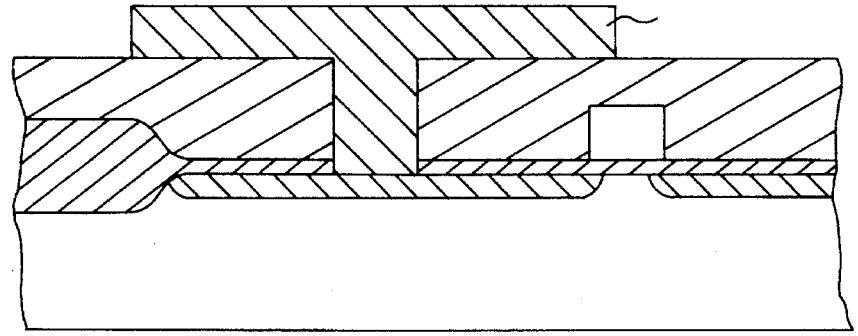

In the second embodiment, after the completion of the second process in film formation device 305, the substrate is transported to an oxidation device 304 through the medium of the tunnel having the structure shown in FIG. 24, and oxidation processing is conducted in oxidation device 304. The atmosphere in the interior of the tunnel is maintained so as to comprise a highly pure air atmosphere having a moisture content of less than 10 ppb.

Figure 19A:
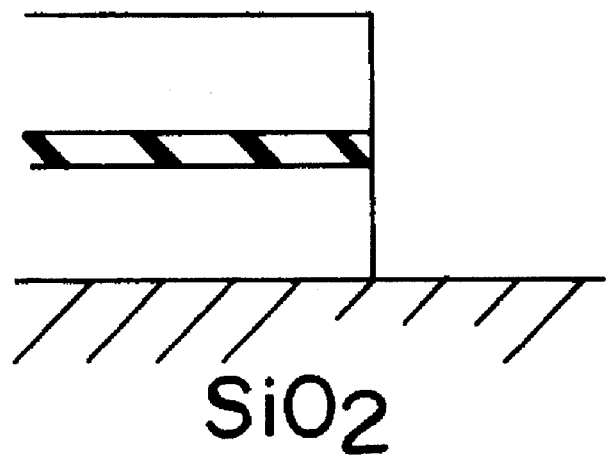
FIGS. 19a to 19b are a process cross sectional diagram in accordance with a third embodiment of the present invention.
Figure 19B:
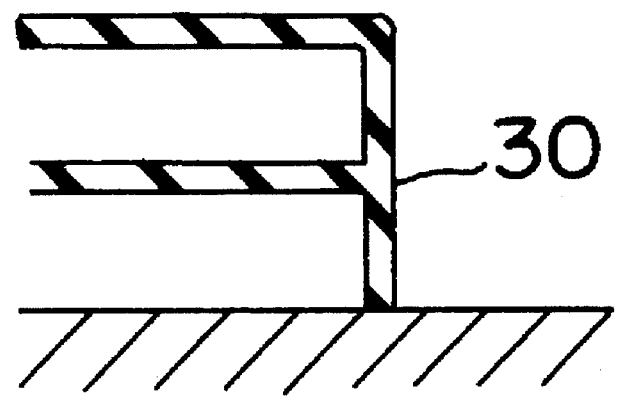
Figure 20A:
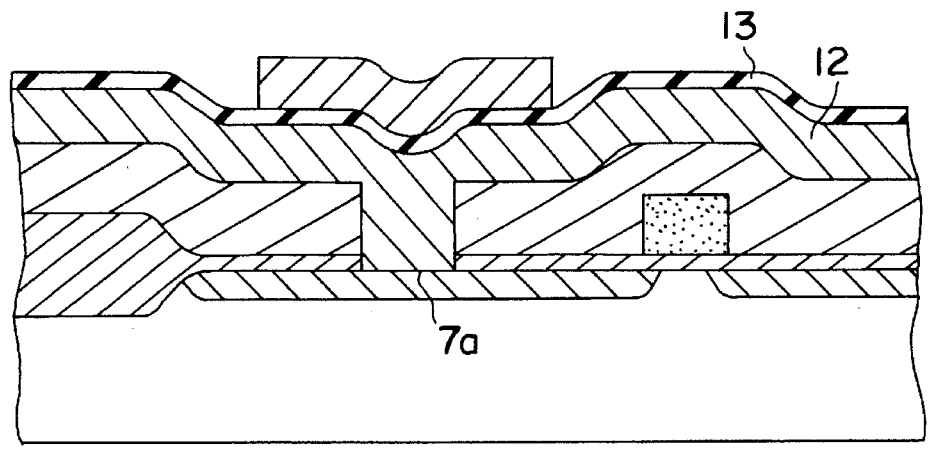
FIGS. 20a to 20b are a process cross sectional diagram in accordance with a fourth embodiment of the present invention.
Figure 20B:
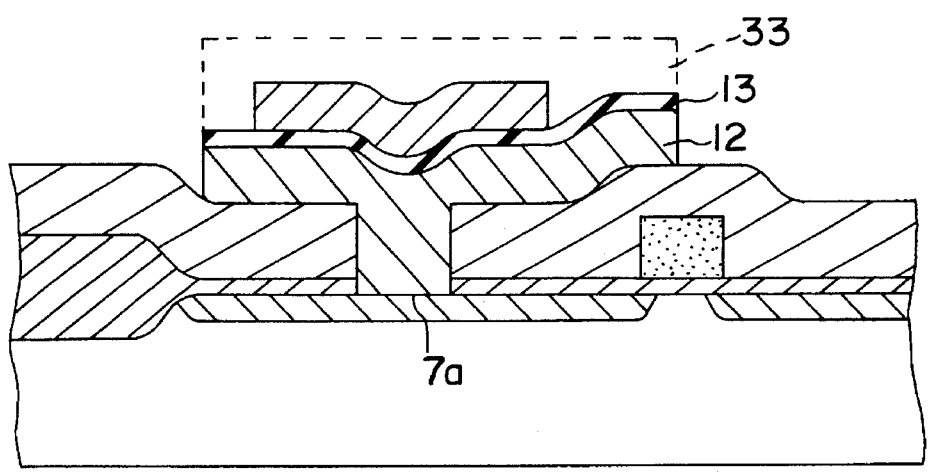
Figure 20C:
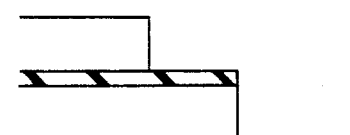
Figure 20D:
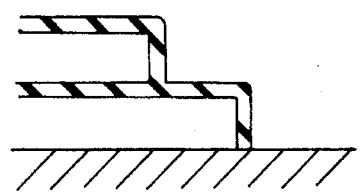
Figure 21A:
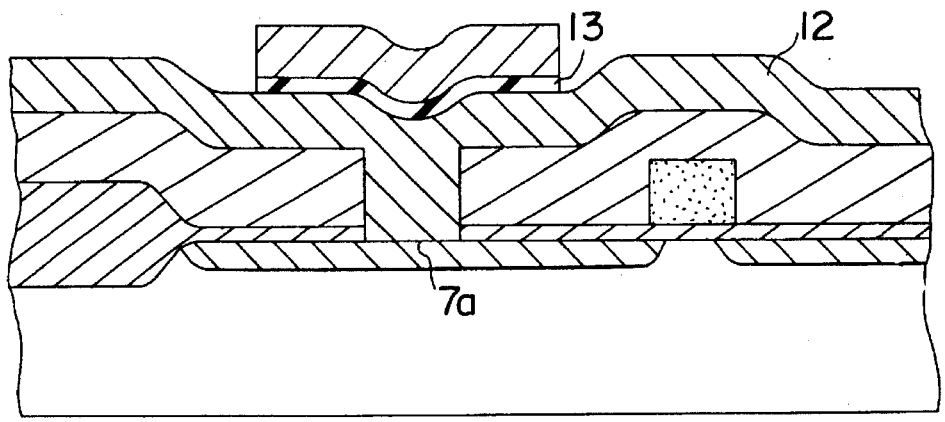
FIGS. 21a to 21b are a process cross sectional diagram in accordance with a fifth embodiment of the present invention.
Figure 21B:
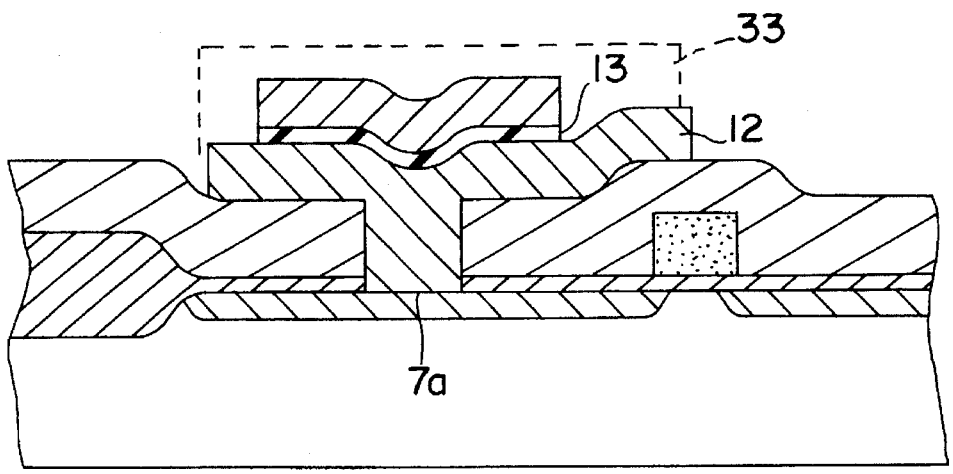
Figure 21C:
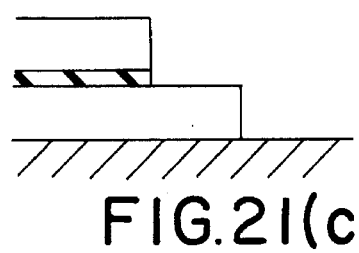
Figure 21D:
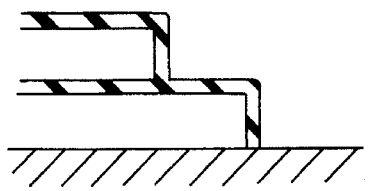
Figure 23:
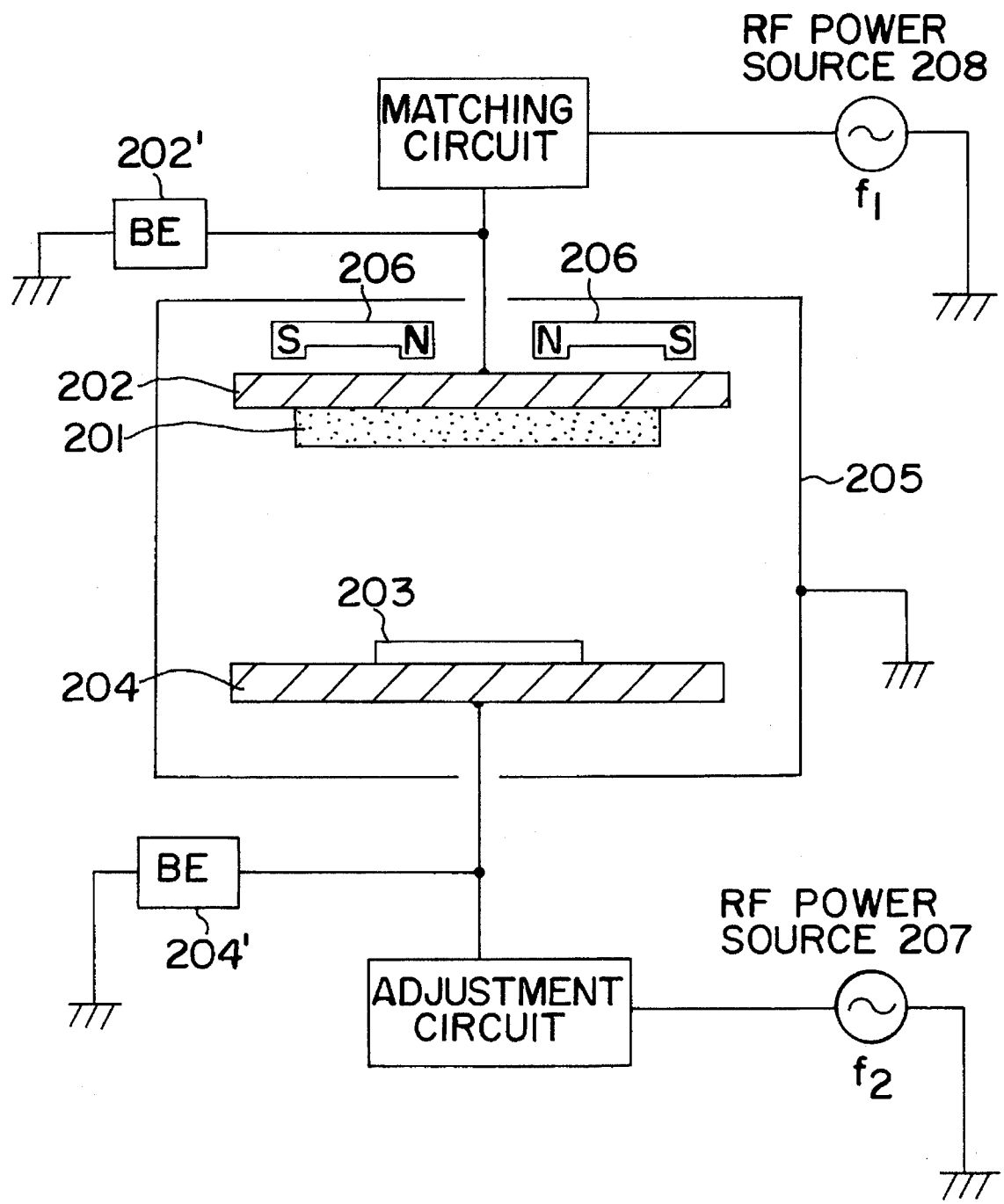
FIG. 23 is a conceptual drawing of an example of an device used in the formation of a film and the like in the present invention.

In the third embodiment, in the state of Embodiment 1 shown in FIG. 13, oxidation is conducted. By means of such oxidation, the edge regions which were damaged as a result of etching (the region A of FIG. 13, and FIG. 19(*a*)) have oxidized films 30 formed at side surfaces thereof (FIG. 19(*a*)), so that a distinct improvement in breakdown voltage is achieved.

In the fourth embodiment, the process followed is identical to the process of embodiment i shown in FIG. 12; however, when RIE etching is conducted in the state shown in FIG. 12, only etching of Ta film 14 is conducted, and after the completion of the etching of Ta film 14 (FIG. 20(*a*)), resist is again applied, and a resist pattern 33 is formed by means of photolithography (FIG. 20(*b*)), RIE etching is conducted, and the edge regions have the structure shown in FIG. 20(*c*).

In order to further increase the resistance to breakdown, in a manner similar to that of Embodiment 3, oxidation processing is conducted, and the oxide film shown in FIG. 20(*d*) is formed.

In Embodiment 4, in embodiments state shown in FIG. 12, etching of only the Ta film 14 was conducted; however, in the the Ta film 14, and the Ta₂O₅ film 13 is subjected to etching. However, this example is distinguished from Embodiment 1 in that Ta film 12 is allowed to remain (FIG. 21(*a*)).

Next, a pattern is formed in the resist as shown by the dotted line in FIG. 21(*b*), and the edge regions have the structure shown in FIG. 21(*c*).

In the present example, by means of conducting a further oxidation, the side surfaces which received damage as a result of etching are oxidized, and the edge regions have the structure shown in FIG. 21(*d*).

In the sixth embodiment, in FIG. 9, in place of the Ta film 12, a film having a 2-layer structure, wherein the lower layer comprises Cr and the upper layer comprises Ta, is formed. It should of course be understood that a multilayered structure of 3 layers or more is also acceptable. In the case of a multilayered structure, it is preferable that the bottommost layer comprise a Cr layer, as In the case of the present embodiment. The adhesion of Cr to $SiO_2$ is good, so that this is preferable.

In the seventh embodiment, the upper electrode comprises Ti, and the subsequent processes are conducted at a temperature of 500° C. or below.

In the eighth embodiment, the oxidation of the surface of the Ta film comprising lower electrode 12 is conducted in the following manner.

That is to say, highly pure oxygen gas is supplied to the film deposition chamber, and the surface of the Ta film is irradiated with Ar ions having a kinetic energy of 30 eV. By means of such a method, the DRAW1 which is produced exhibits a high breakdown voltage, and possesses a large capacitance.

In accordance with the present invention, it is possible to manufacture, easily and with a high yield, an DRAM memory cell which has a high breakdown voltage and possesses a large capacitance.

Modifications of the invention herein disclosed will occur to a person skilled in the art and all such modifications are deemed to be within the scope of this invention as defined by the appended claims.

What is claimed is:

1. A method for manufacturing memory cells of a DRAM, wherein said method comprises:

a first process, in which a first region having an opposite conductive type from that of a substrate is formed, and a surface of said first region of said substrate, which surface is covered with an insulation film, is exposed, a second process, in which a metal film comprising at least one layer is formed, a third process, in which a metal oxide film is formed on a surface of said metal film by means of direct oxidation of said surface of said metal film which is conducted by means of supplying oxygen gas to a surface of said metal film, and by irradiating said surface with inert gas ions having a kinetic energy of 90 ev or below, a fourth process, in which a conductive film comprising at least one layer is formed, and a fifth process, in which wiring lines are formed after formation of an interlayer insulation film.

2. A method for manufacturing memory cells of a DRAM in accordance with claim 1, wherein said second process and said third process are consecutively conducted in a single vacuum chamber without disruption of a vacuum thereof.

3. A method for manufacturing memory cells of DRAM in accordance with claim 2, wherein said second process, said third process, and said fourth process are consecutively conducted in a single vacuum chamber without disruption of a vacuum thereof.

4. A method for manufacturing memory cells of DRAM in accordance with claim 3, wherein said first process, said second process, said third process, and said fourth process are consecutively conducted in a single vacuum chamber without disruption of a vacuum thereof.

5. A method for manufacturing memory cells of DRAM in accordance with claim 1, wherein transportation of a substrate between said second process and said third process is conducted in an inert gas atmosphere or in a highly pure air atmosphere having a moisture concentration of 10 ppb or below.

6. A method for manufacturing memory cells of a DRAM in accordance with claim 5, wherein transportation of a substrate between said second process, said third process, and said fourth process is conducted in an atmosphere of an inert gas or in an highly purified air atmosphere having a moisture concentration of 10 ppb or below.

7. A method for manufacturing memory cells of DRAM in accordance with claim 6, wherein transportation of a substrate between said first process, said second process, said third process, and said fourth process is conducted in a atmosphere of an inert gas or in a highly purified air atmosphere having a moisture concentration of 10 ppb or below.

8. A method for manufacturing memory cells of a DRAM in accordance with claim 1, wherein said metal film and said conductive film comprise an identical material.

* * * * *